United States Patent
Sano et al.

(10) Patent No.: US 8,173,336 B2
(45) Date of Patent: May 8, 2012

(54) CIRCUIT PATTERN FORMATION DEVICE AND METHOD OF FORMING CIRCUIT PATTERN

(75) Inventors: Yuichiro Sano, Mito (JP); Toru Miyasaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1194 days.

(21) Appl. No.: 11/829,137

(22) Filed: Jul. 27, 2007

(65) Prior Publication Data

US 2008/0026307 A1    Jan. 31, 2008

(30) Foreign Application Priority Data

Jul. 27, 2006 (JP) ................. 2006-204070

(51) Int. Cl.
*G03G 21/00* (2006.01)
(52) U.S. Cl. .......... 430/48; 399/237; 399/249; 399/348
(58) Field of Classification Search .............. 430/48; 399/249, 237, 348
See application file for complete search history.

(56) References Cited

U.S. PATENT DOCUMENTS

| 4,671,309 A * | 6/1987 | Iemura et al. ................. 399/57 |
| 5,053,823 A * | 10/1991 | Oh-ishi et al. ................ 399/251 |
| 6,650,857 B2 * | 11/2003 | Nukada et al. ................ 399/249 |
| 2006/0072944 A1 * | 4/2006 | Sharma et al. ................ 399/308 |
| 2008/0267680 A1 * | 10/2008 | Sano et al. .................... 399/348 |

FOREIGN PATENT DOCUMENTS

| JP | 04-350877 | 12/1992 |
| JP | 10-010874 | 1/1998 |
| JP | 2002091171 | 3/2002 |
| JP | 2004-184598 | 7/2004 |
| JP | 2006278801 | 10/2006 |

* cited by examiner

*Primary Examiner* — Thorl Chea
(74) *Attorney, Agent, or Firm* — Antonelli, Terry, Stout & Kraus, LLP.

(57) ABSTRACT

The purpose of the present invention is to provide a method for transferring a pattern of a circuit pattern precursor formed of electroconductive particles containing no resin component onto an objective substrate with high transfer efficiency while retaining a pattern shape. A method of transferring the circuit pattern precursor formed from an conductive particle dispersed solution on a dielectric thin film body includes the steps of: temporarily removing a liquid film remaining around the circuit pattern precursor right after a development step; subsequently re-electrifying the electroconductive particle pattern by supplying a solvent again to the circuit pattern precursor; and then electrostatically transferring the pattern onto the objective substrate through electrophoresis in the solvent.

10 Claims, 2 Drawing Sheets

CIRCUIT PATTERN FORMATION DEVICE AND METHOD OF FORMING CIRCUIT PATTERN

BACKGROUND OF THE INVENTION

1. Field of the Invention

The present invention relates to a circuit pattern formation device for forming a circuit pattern on a printed circuit board or the like, and a method of forming the circuit pattern.

2. Background of the Invention

Attention has been given to a system for forming a circuit pattern on a substrate by a printing process consisting of simple steps such as a screen printing process, a dispenser process, an inkjet printing process and an electrophotography printing process, as a substitutional technology for a conventional photolithographic system which needs an expensive mask and multistage process. Any of the processes forms a pattern by using a conductive particle dispersed solution containing electroconductive particles dispersed in a solvent, or a toner containing electroconductive particles added into a resin, and by applying the dispersion or the toner indirectly with a printing plate or a screen, directly with a nozzle scanning technique, or with an electrostatic adsorption technique. And the wirings are formed by heating the substrate to bake the pattern and by causing fusion-bond of the particles to form a conductor.

Among the various printing processes described above, the electrophotographic system of forming a desired circuit pattern on an insulation substrate with the use of an electrostatic force has many advantages in comparison with the other processes, because the system can be used for not only mass production and large-area pattern formation but also change of the circuit pattern which is advantageous for high-mix low-volume production. Among the electrophotographic systems, in particular, a liquid development system of using a conductive particle dispersed solution containing electroconductive particles dispersed in a solvent as a developer is advantageous in that the liquid development system can enhance a resolution of the pattern and lower a baking temperature at which the electroconductive particles are fused into a conductor, because the system can prevent particles from scattering by dispersing them in a liquid and can use conductive particles with a smaller grain size.

In a pattern formation device with the use of the liquid development system the surface of a photoreceptor is uniformly electrified and a desired electrostatic latent image is formed using a laser scan exposure system. And then, the electrostatic latent image is contacted with a liquid developer and particles of a pattern formation material dispersed in the liquid are electrostatically adsorbed onto the electrostatic latent image through electrophoresis to develop the pattern, and the obtained developed pattern is directly or indirectly transferred onto an objective substrate.

The means for transferring the developed pattern in the above described process includes a method of transferring the developed pattern by applying heat or pressure on the pattern; and a method of transferring the developed pattern through an electrostatic force by applying an electric field to the particles (see e.g. JP-A-2002-91171).

BRIEF SUMMARY OF THE INVENTION

When a circuit pattern precursor developed on a photoreceptor is transferred onto an objective substrate through heat or pressure in a pattern formation of forming a circuit pattern by a liquid development system, a resin component needs to be dispersed in a conductive particle dispersed solution, or the electroconductive particles need to have a resin layer on the outermost layer. This is because stickiness caused by the resin components is indispensable for the particles to be transferred by the heat or pressure. However, if these resin components would exist in the conductive particle dispersed solution, the resin components remain in the pattern when the particles are converted into a conductor by heating and baking, and thereby causing the problem of increasing a resistance value of the formed a circuit pattern.

There are some methods of forming a circuit pattern by a liquid development system. One of them employs a way of leaving a solvent remaining around the circuit pattern precursor right after the development and of transferring the pattern by electrophoresis through a solvent existing in between a photoreceptor and an objective substrate when transferring the circuit pattern precursor developed on the photoreceptor on to the substrate by an electrostatic force. Another method employs a way of drying and removing the solvent remaining around the circuit pattern precursor right after the development, of re-electrifying the dried circuit pattern precursor by an electrifier, and of making the precursor electrostatically adsorbed onto the objective substrate, as described in JP-A-2002-91171.

In the former case, electroconductive particles in a conductive particle dispersed solution can electrophoretically migrate to a substrate as long as the particles are electrified by the adsorption of ions, even though there are no resin components in the solution. However, the developed particles have low mutual adhesiveness and the pattern is easily damaged by an external force. As a result, the above method has a problem that a pattern shape cannot be kept due to a solvent flow occurring when the pattern is transferred onto an objective substrate. The above method has also a problem of lowering the transfer efficiency of the electroconductive particles to be transferred onto the objective substrate, because the electrified electroconductive particles in a liquid interact with an electric charge remaining in a latent image on a photoreceptor.

The latter method described in JP-A-2002-91171 does not cause a pattern damage due to a flow of the solvent, because the method includes drying a pattern after having been developed and does not make a solvent interpose between a photoreceptor and a substrate at the time of the transferring. However, the method described in JP-A-2002-91171 is not directed to forming the circuit pattern but to forming a pictorial image using a color component, and the particles need to inevitably have a resin layer thereon so that the dried particles can be re-electrified by an electrifier and the electrostatic transfer can be applied thereto. If a circuit pattern would be formed by this method, a resin component would increase a resistance value of wiring, as was described above.

The present invention is designed so as to solve the above described problems. The present invention relates to provide a method of forming a circuit pattern using electrophotographies at a high transfer efficiency while keeping the shape of the pattern, which transfers a circuit pattern precursor on an objective substrate without using a resin component that causes the increase of a resistance value of the obtained circuit pattern, and to provide a circuit pattern formation device therefor.

Other objects, features and advantages of the invention will become apparent from the following description of the embodiments of the invention taken in conjunction with the accompanying drawings.

DESCRIPTION OF REFERENCE NUMERALS

Figure 1:
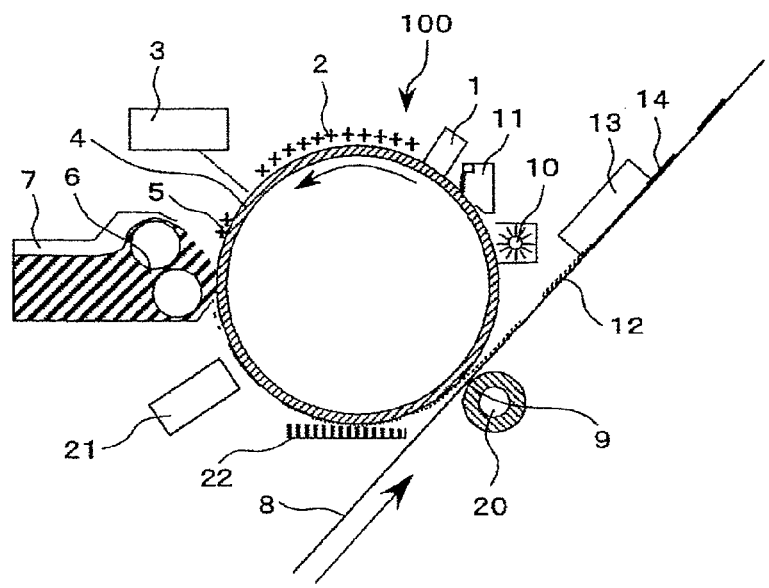
FIG. 1 is a schematic block diagram illustrating a method of forming a circuit pattern by an electrophotographic technique according to the present invention.

1 ... electrification device
2 ... region
3 ... exposure device
4 ... dielectric thin film body
5 ... electrostatic latent image pattern
6 ... conductive particle dispersed solution
7 ... developing device
8 ... objective substrate
9 ... transfer unit
10 ... unit for erasing remaining latent image
11 ... unit for cleaning remaining electroconductive particles
12 ... electroconductive particle pattern
13 ... heating device
14 ... circuit pattern
15 ... nonpolar solvent
16 ... ionic organic molecule
17 ... electroconductive particle
18 ... inorganic ion
19 ... aliphatic acid ion
20 ... transfer roll
21 ... liquid film removal unit
22 ... liquid film application unit

DETAILED DESCRIPTION OF THE INVENTION

In order to achieve the above described purposes of the present invention, the present invention provides a method of transferring a circuit pattern precursor which has been formed from a conductive particle dispersed solution on a photoreceptor, comprising the steps of: temporarily removing a solvent remaining on a pattern right after the development, re-supplying the solvent to an circuit pattern precursor with an remaining electrostatic latent image on the photoreceptor, thereby re-electrifying the electroconductive particle pattern by an ion adsorption, and then transferring the pattern onto the objective substrate by an electrostatic force.

A transferring system according to the present invention can transfer a circuit pattern precursor composed of electroconductive particles onto an objective substrate while keeping a pattern shape at a high transfer efficiency, wherein the electroconductive particles do not include a resin component and can provide electric wiring with low resistance by a baking at a low temperature.

In the next place, a method of forming a circuit pattern with the use of an electrophotographic system according to the present invention will be described with reference to the drawings.

FIG. 1 schematically illustrates a device which employs a method of forming a circuit pattern with the use of an electrophotographic system according to the present invention. The present device is mainly composed of an electrification device 1, a dielectric thin film body 4, an exposure device 3, a conductive particle dispersed solution 6, a developing device 7, a film removal unit 21, a liquid film application unit 22, a transfer unit 9, a substrate 8 to be pattern-formed (objective substrate 8) and a heating device 13.

The circuit pattern formation device in the present exemplary embodiment employs a drum-shaped photoreceptor provided with a dielectric thin film body 4 having photosensitivity on its surface, as a unit for forming an electrostatic latent image. The surface of the photoreceptor is uniformly electrified by an electrification device 1 arranged around the photoreceptor (composed of any one of a corotron electrifier, a roller contact electrifier or a brush contact electrifier). An exposure device 3 scans a uniformly electrified region 2 by the electrification device 1 with a laser beam according to a picture signal sent from an image information processor such as a personal computer and irradiates an arbitrary part with the light to form an objective electrostatic latent image pattern 5 on the region 2. Alternatively, the circuit pattern formation device may employ another method of forming the desired electrostatic latent image pattern 5 using a stamp electrification having the steps of: applying an electrostatic charge to salients on a body for transferring an electrostatic latent image having an objective pattern formed on the surface beforehand; and making the salients contact with the surface of the uniformly electrified dielectric thin film body 4. However, for the purpose of making the electrostatic latent image pattern 5 to be easily changed, it is preferable to employ the former method of forming the electrostatic latent image pattern 5 by irradiating the uniformly electrified region 2 with the light. Both of the above described methods may form the electrostatic latent image by applying any of positive charge and negative charge to the region.

A developing device 7 develops an electrostatic latent image pattern 5 formed on a photoreceptor to form an circuit pattern by supplying a conductive particle dispersed solution 6 so as to contact with the electrostatic latent image pattern 5. The developing device 7 is provided with a tank for storing the conductive particle dispersed solution 6 therein, and a feed unit (feed roll) for feeding the conductive particle dispersed solution 6 to the electrostatic latent image pattern 5 on a dielectric thin film body 4. The developing device 7 forms the film of the conductive particle dispersed solution on the feed roll, and supplies the conductive particle dispersed solution to the electrostatic latent image pattern 5 by making the above film contact with the electrostatic latent image pattern 5. A storage tank has a concentration-detecting unit arranged therein so as to detect the concentration of the conductive particle dispersed solution 6. The developing device 7 has a concentration-adjusting unit for adjusting the concentration of the conductive particle dispersed solution 6, by adding a nonpolar solvent 15 or electroconductive particles 17 into the storage tank on the basis of concentration information obtained by the detecting unit. The storage tank is also provided with a stirring unit for preventing the sedimentation of the particles and for uniformizing the concentration in the whole region. A usable stirring unit includes an ultrasonic irradiation stirring unit which stirs the conductive particle dispersed solution by applying an ultrasonic wave to the solution, a stirring unit which mechanically stirs the inside of the solution with a stirring blade or the like, and a vibration unit which stirs the solution by vibrating the storage tank itself. The unit for supplying the conductive particle dispersed solution 6 includes a method for forming a layer of the conductive particle dispersed solution 6 on the above described roll to make the layer contact with the electrostatic latent image, a method for spraying the conductive particle dispersed solution 6 through a nozzle, and a method for immersing an dielectric thin film body 4 having the electrostatic latent image pattern 5 formed thereon into the stored conductive particle dispersed solution 6.

Figure 2:
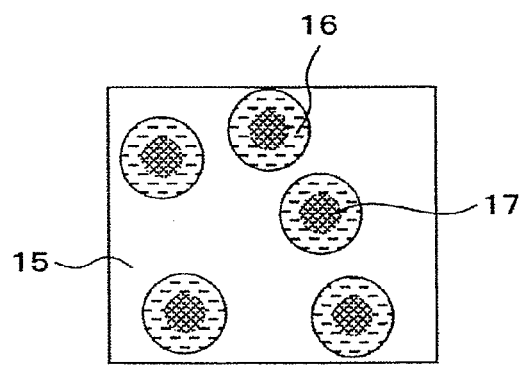
FIG. 2 is a schematic view illustrating a conductive particle dispersed solution according to the present invention.
Figure 3:
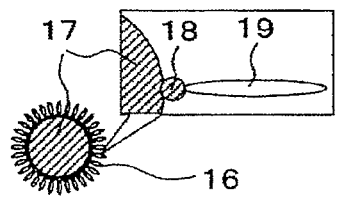
FIG. 3 is a schematic view illustrating electroconductive particles having ionic organic molecules thereon with a low molecular weight.

The detail of a conductive particle dispersed solution 6 is illustrated in FIG. 2. The conductive particle dispersed solution 6 is formed by dispersing electroconductive particles 17 in a nonpolar solvent 15, wherein the electroconductive particles 17 have particle diameters of 100 nm or less adsorbing ionic organic molecules 16 on the surfaces.

When an ionic organic molecule 16 is formed from a macromolecule, the ionic organic molecule 16 includes the following single polymeric resin or a mixture polymeric resin thereof having a functional group such as a carboxylate group or an amino acid group, wherein the functional group can impart ionicity to the resins. The polymeric resin includes: a homopolymer of styrene, a substitution product thereof, and a copolymer thereof, such as polystyrene, poly-p-chlorostyrene, polyvinyltoluene, a styrene-p-chlorostyrene copolymer and a styrene-vinyltoluene copolymer; a copolymer of styrene and an acrylic ester, such as a styrene-methyl acrylate copolymer, a styrene-ethyl acrylate copolymer and a styrene-n-butyl acrylate copolymer; a copolymer of styrene and a methacrylic ester, such as a styrene-methyl methacrylate copolymer, a styrene-ethyl methacrylate copolymer and a styrene-n-butyl methacrylate copolymer; a polyphyletic copolymer of styrene, an acrylic ester and a methacrylic ester; a styrenic copolymer of styrene and other vinyl monomer, such as a styrene-acrylonitrile copolymer, a styrene-vinylmethylether copolymer, a styrene-butadiene copolymer, a styrene-vinylmethylketone copolymer and a styrene-maleate copolymer; a methacrylic ester resin such as polymethyl methacrylate and polybutyl methacrylate; an acrylic ester resin such as polymethyl acrylate, polyethyl acrylate and polybutyl acrylate; a polyester resin; an epoxy resin; and a cycloolefin copolymer.

When the ionic organic molecule 16 is formed from an organic molecule with a low molecular weight, the ionic organic molecule 16 includes an inorganic salt of an aliphatic carboxylic acid, which is composed of an acidic ion 19 of an aliphatic carboxylic acid and an inorganic ion 18. The aliphatic carboxylic acid includes: a dicarboxylic acid such as oxalic acid, malonic acid, succinic acid, adipic acid, glutaric acid, 2,4-diethyl glutaric acid, 2,4-diethyl glutaric acid, pimelic acid, azelaic acid, sebacic acid, cyclohexanedicarboxylic acid, maleic acid, fumaric acid and diglycollic acid; an aliphatic acid such as caprylic acid, lauryl acid, myristic acid, palmitic acid, stearic acid, arachic acid, behenic acid, linoleic acid, oleic acid and linolenic acid; a hydroxy carboxylic acid such as lactic acid, hydroxy pivalic acid, dimethylol proprionic acid, citric acid, malic acid and glyceric acid. The inorganic ion 18 includes an ion of Ag, Cu, Au, Pd, Pt, Ni, W, Mo, Cr, and so on.

In order to convert an electroconductive particle pattern 12 into a conductor, it is necessary to eliminate an organic component around an electroconductive particle 17 by heating and burning it. Thermal energy necessary for burning the organic component is lower in a low-molecular component than in a high-molecular component. Accordingly, when a substrate made from a polyimide resin or the like having low heat resistance is used as an objective substrate 8 for forming a circuit pattern thereon, a low-molecular organic molecule with a low burning temperature is preferably used as the organic component around the electroconductive particle 17. In addition, the use of the low-molecular organic molecule decreases a ratio of an organic molecule remaining in the circuit pattern, which causes the increase of an electric resistance in the pattern converted into the conductor, in comparison with the use of the high-molecular organic molecule. From the above described viewpoint, the organic molecular component around the electroconductive particles 17 is preferably the organic molecule with a low molecular weight.

The particle diameter of the electroconductive particle 17 needs to be 100 nm or less so that the fusion-bonded can occur at a low temperature and a circuit pattern 14 can show a high resolution. However, the particle diameter of the electroconductive particle 17 shall be 10 nm or less in order to fuse-bond the electroconductive particles 17 by heating at 200° C. or lower to convert the electroconductive particle pattern 12 into a conductor. The particle diameter of the electroconductive particle 17 shall be 5 nm or less, when the circuit pattern 14 needs to be formed of lines with the width of 100 nm or less.

A usable material for an electroconductive particle 17 includes a single metal of Ag, Cu, Au, Pd, Pt, Ni, W, Mo, Cr or the like; an oxide of a metal thereof; and an alloy of the metals. When a pattern needs to be a conductor, Ag or Cu is used which has low volume resistivity. Also, it is possible to use a mixture of the above described metal, an oxide thereof, or a alloy thereof.

An aliphatic hydrocarbon-based solvent is used for a nonpolar solvent 15. The aliphatic hydrocarbon-based solvent includes an isoparaffin-based solvent, a petroleum naphtha-based solvent, Isopar (ExxonMobil Chemical Company), IP solvent (Idemitsu Kosan Co., Ltd.), Soltrol (Phillips Petroleum Company), and other carbon hydrides.

A method of forming a circuit pattern by using an electrophotographic system according to the present invention includes a step of transferring an electroconductive particle pattern 12 developed on a dielectric thin film body 4 onto an objective substrate 8. A transfer unit 9 adopts an electrostatic transfer system of applying voltage from a back face through a layer to be transferred of the objective substrate 8, and of transferring the electroconductive particle pattern 12 developed on the dielectric thin film body 4 onto the objective substrate 8 by an electrostatic force. Electroconductive particles 17 composing the electroconductive particle pattern 12 are electrified only in a solvent, so that the solvent needs to exist in a gap between the dielectric thin film body 4 and the objective substrate 8 when the electroconductive particles 17 are electrostatically transferred onto the objective substrate 8. A liquid film of the nonpolar solvent 15 in a conductive particle dispersed solution 6 exists on the dielectric thin film body 4 right after the development. Accordingly, the liquid film layer can be directly used as the solvent indispensable for the transfer step. However, electroconductive particles 17 in the electroconductive particle pattern 12 formed on the dielectric thin film body 4 do not have a high interparticle force. Accordingly, the flow of the liquid occurring in the transfer unit 9 section redisperses the particles and easily damages the pattern. In addition, when the electroconductive particles 17 are carried to the section of the transfer unit 9 in the state of retaining the liquid film that remains right after the development, the latent image pattern used for the development remains in the state on a photoreceptor. Then, the electroconductive particles 17 composing the electroconductive particle pattern 12 hardly desorb from the latent image on the dielectric thin film body 4, because of a strong electrostatically-interacting force between the above electroconductive particles 17 and the above latent image. As a result of this, the transfer efficiency remarkably decreases which shows the rate of the electroconductive particle pattern 12 transferred onto the objective substrate 8 in the section of the transfer unit 9.

Figure 4:
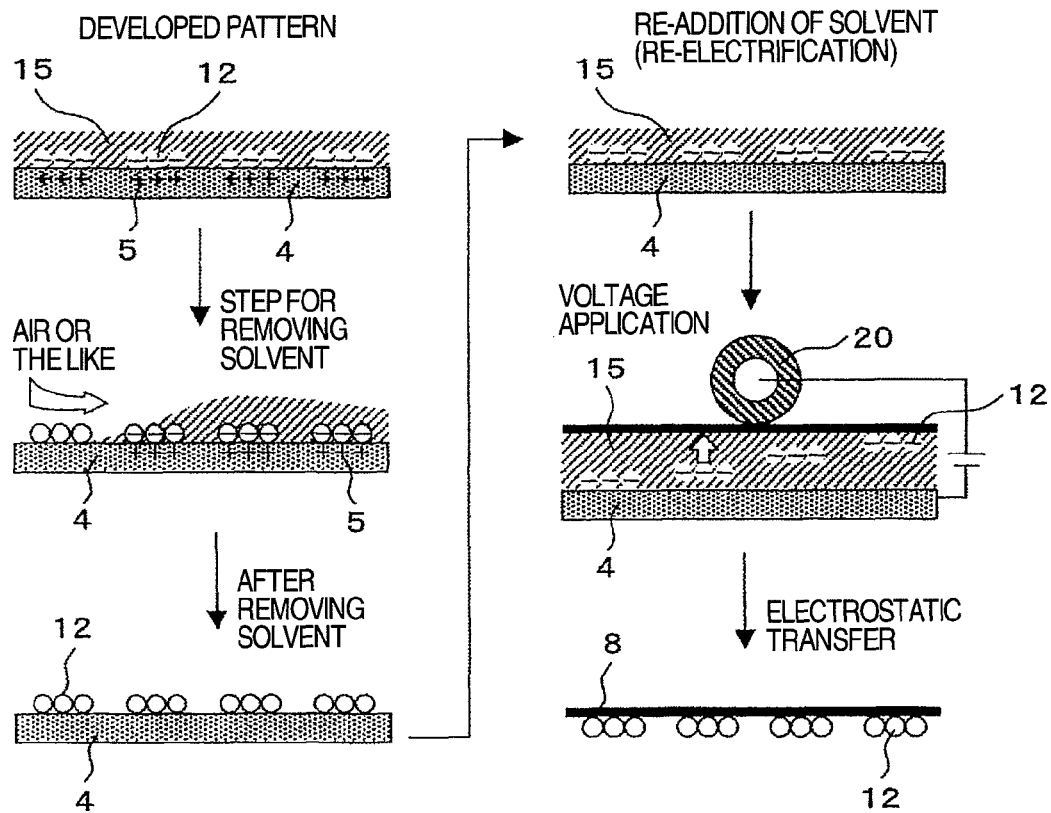
FIG. 4 is a schematic view illustrating a process of transferring a developed pattern onto a substrate according to the present invention.

For this reason, a method of forming a circuit pattern according to the present invention shall include the steps of: a step (i.e. a step of removing solvent) of removing a liquid film on an electroconductive particle pattern 12 formed at a developing step before moving to a transfer step; and a step (i.e. a step of adding solvent again) of adding the liquid film again afterward before moving to the transfer step, as are shown in FIG. 4. When the liquid film is temporarily removed from the electroconductive particle pattern 12 right after the development, electroconductive particles 17 composing the electroconductive particle pattern 12 agglutinate and the interparticle force thereof increases. The pattern acquires the improved retainability, and can avoid the pattern damage when being transferred. In addition, when the liquid film is removed, an electrostatic latent image remaining on the dielectric thin film body 4 is also erased, and the electroconductive particle pattern 12 can be easily detached from the surface of the dielectric thin film body 4. As a result, the transfer efficiency is improved. However, when the pattern is electrostatically transferred by electrophoresis, a solvent inevitably exists between the dielectric thin film body 4 and an objective substrate 8, so that the method of forming the circuit pattern according to the present invention requires a step of applying the solvent again onto the electroconductive particle pattern 12 from which the solvent has been once removed.

The following method can be considered as a liquid film removal unit 21 for temporarily removing a liquid film from the surface of an electroconductive particle pattern 12 right after the development. Firstly, conceivable methods are a heating method of using a heating unit for vaporizing and drying a solvent by heating the solvent or blowing hot blast to the solvent, and a gas flow method of using a blowing unit for blowing a gas flow on the liquid film in order to remove the liquid film by blowing away from the surface of the electroconductive particle pattern 12. Among those, the heating method may need a long period of time for vaporizing the liquid and may promote the deterioration of a dielectric thin film body 4 due to the heat. For this reason, it is preferable to use the gas flow method. It is not preferable to blow a gas flow in such a direction as the liquid film blown away flows to a transferring site (direction of the already-removed electroconductive particle pattern 12), and in such a direction as the liquid film flows to a developing site (direction of the electroconductive particle pattern 12 which retains the liquid film therein right after the development). Accordingly, it is preferable to blow the gas in such a direction as the liquid film is blown away from the center in the middle of a transfer point and a development point toward an end of the dielectric thin film body 4 (width direction), or to blow away the liquid film similarly in the width direction from one end of the dielectric thin film body 4 to the other end of the dielectric thin film body 4. Furthermore, in this case, the liquid film removal unit 21 preferably has a liquid film collection unit for collecting the liquid film blown away at the end of the dielectric thin film body 4. A conceivable liquid film collection unit includes a method of forming a groove in the end of the dielectric thin film body 4 and of collecting the liquid film through the groove, and a method of arranging a sponge member which can absorb the liquid film. Furthermore, in order to shorten the period of time for removing the liquid, the liquid film collection unit may have a configuration of sucking and collecting the liquid film which has flowed to the end of the dielectric thin film body 4 due to a negative pressure. The liquid film collection unit preferably has the configuration of carrying the collected solvent to a developing device 7 in order to recycle it.

A conceivable liquid film application unit 22 for adding a solvent again onto an electroconductive particle pattern 12 from which a liquid film has been removed to form the liquid film again includes a method of immersing a dielectric thin film body 4 having an electroconductive particle pattern 12 retained thereon into a saucer-shaped member filled with the solvent, and passing the thin film body 4 through the inside of the member; and a method of spraying the solvent using a spraying device to form the liquid film again. Here, as described above, in the electroconductive particle pattern 12 after applying the liquid film again, an interactive force between the electroconductive particle pattern 12 and the surface of the dielectric thin film body 4 becomes low because a remaining latent image has been erased when the liquid film has been removed. As a result, the electroconductive particle pattern 12 is easily detached from the dielectric thin film body 4 by a physical external force. For this reason, the method of forming the liquid film again by solvent spray may cause the pattern damage by receiving a physical force of a blown airflow. Accordingly, it is preferable to employ the method of immersing the electroconductive particle pattern 12 in a saucer filled with the solvent and passing the pattern 12 through the saucer. The above described solvent to be added again is preferably formed of the same component as in the nonpolar solvent 15 of the conductive particle dispersed solution 6.

Figure 5:
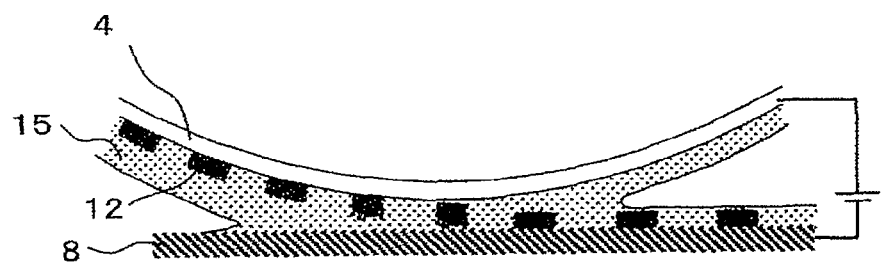
FIG. 5 is a schematic view illustrating an electrostatic transfer process using an electrophoretic technique according to the present invention.

A unit of forming a circuit pattern using an electrophotographic system forms a liquid film again in a liquid film application unit 22. The unit of forming the circuit pattern has a transfer unit 9 for moving a circuit pattern precursor 12 consisting of electroconductive particles 17 which are re-electrified in liquid from the surface of a dielectric thin film body 4 onto an objective substrate 8 while the pattern is kept. When being transferred by this transfer method, this electroconductive particle pattern 12 is in a state of being sandwiched between the face of the dielectric thin film body 4 and the surface the objective substrate 8, as is shown in FIG. 5. A gap between the dielectric thin film body 4 and the surface of the objective substrate 8 is filled with a solvent applied by the liquid film application unit 22. The electrostatic transfer system applies voltage from the back surface of the objective substrate 8 in the state, and transfers the electroconductive particle pattern 12 onto the objective substrate 8 from the dielectric thin film body 4 due to an electrophoretic phenomenon. To the transfer unit 9, a positively biased voltage is applied when the electroconductive particles 17 composing the electroconductive particle pattern 12 are negatively electrified in the liquid, and a negatively biased voltage is applied when the electroconductive particles 17 are positively electrified. In addition, it is preferable that a member for applying the voltage is formed of a roll which has an electroconductive elastic body provided on its surface, and which has such a structure as to be capable of applying a pressing force of 100 g-weight/cm or higher to the dielectric thin film body 4 while rotating in a direction of following the rotation of the dielectric thin film body 4 at the time of the transferring.

As for an object to be transferred in the present invention, there are a method of directly transferring a circuit pattern onto an objective substrate to be formed, and a method of temporarily retaining the electroconductive particle pattern 12 in the circuit pattern retaining substrate (intermediate transfer body) and then transferring the transferred pattern onto the objective substrate 8. In the case of the method of directly transferring the pattern onto the objective substrate 8, the objective substrate 8 preferably has heat resistance to a temperature of 200 to 250° C., and is a sheet-shaped member having a thickness of 1 mm or less so as to further cope with a transfer bias applied from the back surface of the objective substrate 8. An example of the member composing the above described objective substrate 8 includes a sheet made from a polyimide resin or a ceramic green sheet.

A circuit pattern formation device according to the present invention has a heating device 13 for fixing an electroconductive particle pattern 12 on the objective substrate 8 wherein the electroconductive particle pattern 12 has been transferred onto an objective substrate 8, and for causing a fusion-bonding of electroconductive particles 17 to form a conductor, thereby forming a circuit pattern 14. The heating device 13 not only causes a fusion-bonding of the electroconductive particles 17 but also burns a dispersion agent layer provided on the surface of the electroconductive particles 17. In this case, the circuit pattern formation device may also be provided with a mechanism which can pressurize the electroconductive particle pattern 12 onto the objective substrate 8 while heating the pattern 12. The heating device 13 heats the electroconductive particles 17 to a temperature preferably of 300° C. or lower so as to sufficiently fusion-bond the electroconductive particles 17, so as to burn ionic organic molecules, and so as to prevent the objective substrate 8 from being deformed and denatured. The circuit pattern formation device may also arrange an exhaust unit for exhausting burnt organic components.

A dielectric thin film body 4 in a circuit pattern formation device according to the present invention may have such a structure as to make a latent image formed thereon again after having transferred the circuit pattern, and then as to make the electroconductive particle pattern 12 developed thereon. The dielectric thin film body 4 preferably has a belt shape or a drum shape. In this case, the circuit pattern formation device also has an erasing unit 10 for erasing an electrostatic latent image remaining the dielectric thin film body 4 after having transferred the circuit pattern, and a cleaning unit 11 for removing and collecting remaining electroconductive particles 17. The remaining electroconductive particle cleaning unit 11 can employ a method of making a blade contact with the dielectric thin film body 4 to scrap the remaining electroconductive particles, or a method of washing the remaining electroconductive particles away with a solvent. The removed and collected electroconductive particles 17 may be returned to a developing device 7, be dispersed again in a conductive particle dispersed solution 6 and thus be recycled.

An circuit pattern 14 formed from an conductive particle dispersed solution 6 according to the present invention can be used as wiring on a substrate of a personal computer, a large size electronic computer, a notebook-sized personal computer, a pen-input personal computer, a notebook-sized word processor, a mobile telephone, a portable card, a watch, a camera, an electric shaver, a cordless phone, a facsimile, a video, a video camera, an electronic notebook, an electronic calculator, an electronic notebook with a telecommunication function, a mobile photocopier, a liquid crystal television, an electric power tool, a cleaner, a game device having a function such as virtual reality, a toy, an electrically-operated bicycle, a walker for healthcare, a wheelchair for healthcare, a movable bed for healthcare, an escalator, an elevator, a fork lift truck, a golf cart, a backup power, a load conditioner and a power storage system. The circuit pattern 14 can be also used in military products or space products in addition to the consumer products.

In the next place, a specific example will be described on a method of transferring a developed pattern according to the present invention, but the method is not limited to the following method in particular.

In the present invention, at first, a positive electrostatic latent image pattern with L/S 10 to 100 μm was formed on an a-Si inorganic photoreceptor which was cut into 30 mm×30 mm from an a-Si inorganic photoreceptor drum (product made by Kyocera), through projection exposure with the use of a glass mask. Next, a silver nanoparticle pattern with L/S=10 to 100 μm was obtained by making the obtained latent image pattern contact with a silver nanoparticle developer in which silver nanoparticles are dispersed in Isopar G (a product made by ExxonMobil Chemical Company) of a nonpolar solvent. A layer of a dispersive agent for the silver nanoparticles formed in the above step was made from stearic acid. The above described operations were all carried out in a dark environment.

A liquid film (Isopar G) on the silver nanoparticle pattern formed right after the development step was entirely blown away to an end of the photoreceptor and was removed by blowing air onto the liquid film. Approximately after 10 seconds, the photoreceptor having the silver nanoparticle pattern formed on the surface was slowly immersed in a laboratory dish filled with Isopar G, and the liquid film was formed again on the silver nanoparticle pattern. A polyimide sheet was overlapped on the silver nanoparticle pattern having the liquid film formed thereon again, and a transfer roller made from electroconductive rubber was pressed with a load of 1,000 g-weight from the back surface of the polyimide sheet. The transfer roller was rolled on the polyimide sheet in the state while a transfer bias of +1,000 V was applied, and the silver nanoparticle pattern (L/S 10 to 100 μm) formed on the photoreceptor was transferred onto the polyimide sheet. In this case, the pattern was retained and the transfer efficiency was 90% or higher.

A circuit pattern with high accuracy could be formed on an objective substrate with the above described method.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A circuit pattern formation device using an electrophotographic system comprising:
   a photoreceptor provided with a dielectric thin film body on the surface thereof;
   a developing device for forming an electrostatic latent image pattern on the photoreceptor and for developing the electrostatic latent image pattern of a circuit pattern precursor using a conductive particle dispersed solution formed of dispersed electroconductive particles in a nonpolar solvent, wherein the electroconductive particles have particle diameters of 100 nm or less and adsorb ionic organic molecules on surfaces thereof;
   a liquid film removal unit for removing a liquid film of the nonpolar solvent of the conductive particle dispersed solution from the circuit pattern precursor developed on the photoreceptor;
   a liquid film application unit for forming the liquid film of the nonpolar solvent again on the circuit pattern precursor from which the liquid film has been removed; and
   a transfer unit for transferring the circuit pattern precursor having the liquid film of the nonpolar solvent again formed thereon to an objective substrate.

2. The circuit pattern formation device according to claim 1, wherein the liquid film removal unit comprises a heating unit for heating the circuit pattern precursor, the heating unit removes the liquid film of the nonpolar solvent using the evaporation of the nonpolar solvent by heating the surface of the circuit pattern precursor.

3. The circuit pattern formation device according to claim 1, wherein the liquid film removal unit comprises a blowing unit for blowing airflow onto the surface of the circuit pattern precursor, the blowing unit removes the liquid film of the nonpolar solvent by blowing the liquid film of the nonpolar solvent away to an end of the dielectric thin film body.

4. The circuit pattern formation device according to claim 3, wherein the blowing unit is arranged in a middle part between a developing device and a transfer unit, and blows the airflow from one end of the photoreceptor to the other end in a width direction, or from the center in the width direction of the photoreceptor to both ends.

5. The circuit pattern formation device according to claim 4 further comprising the unit for collecting the blown liquid film by using a negative pressure arranged in the end of the photoreceptor.

6. The circuit pattern formation device according to claim 1, wherein the liquid film application unit which is arranged between the liquid film removal unit and the transfer unit comprises a vessel which contains the nonpolar solvent to be the liquid film, and a configuration of making a dielectric thin film body having the circuit pattern precursor on the surface to be immersed in the vessel.

7. The circuit pattern formation device according to claim 1, wherein the liquid film application unit which is arranged between the liquid film removal unit and the transfer unit comprises a solvent spraying device for spraying the nonpolar solvent to be the liquid film so as to form the liquid film again on the circuit pattern precursor by spraying the nonpolar solvent thereto.

8. The circuit pattern formation device according to claim 1, wherein the conductive particle dispersed solution is converted into a conductor by being heated or pressed.

9. The circuit pattern formation device according to claim 1, wherein the particle diameters are no greater than 10 nm.

10. The circuit pattern formation device according to claim 9, wherein the particle diameters are no greater than 5 nm.

* * * * *